United States Patent
Tomita et al.

(10) Patent No.: US 11,489,524 B2
(45) Date of Patent: Nov. 1, 2022

(54) SEMICONDUCTOR DEVICE

(71) Applicant: LAPIS Semiconductor Co., Ltd., Yokohama (JP)

(72) Inventors: Takashi Tomita, Yokohama (JP); Manabu Furuta, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 3 days.

(21) Appl. No.: 16/664,167

(22) Filed: Oct. 25, 2019

(65) Prior Publication Data
US 2020/0136621 A1    Apr. 30, 2020

(30) Foreign Application Priority Data
Oct. 29, 2018    (JP) .............................. JP2018-202824

(51) Int. Cl.
*H03K 19/0175*    (2006.01)
*G09G 3/20*    (2006.01)

(52) U.S. Cl.
CPC ....... *H03K 19/017509* (2013.01); *G09G 3/20* (2013.01); *G09G 2310/08* (2013.01)

(58) Field of Classification Search
CPC ............. H03K 19/017509; G09G 3/20; G09G 2310/08
See application file for complete search history.

(56) References Cited

U.S. PATENT DOCUMENTS

| | | | | |
|---|---|---|---|---|
| 5,687,321 A * | 11/1997 | Allen | .................. | H04L 25/0272 327/65 |
| 6,486,695 B1* | 11/2002 | Nakagawara | ............ | H03K 5/08 326/13 |
| 6,650,149 B1* | 11/2003 | Wong | ................... | H03K 5/1252 327/14 |
| 6,781,456 B2* | 8/2004 | Pradhan | .................... | H03F 3/68 326/14 |
| 6,977,529 B2* | 12/2005 | Self | ........................ | H03K 5/08 327/12 |
| 7,102,392 B2* | 9/2006 | Hsu | ...................... | G01R 19/165 327/20 |
| 7,317,461 B2* | 1/2008 | Uchida | ................... | G09G 5/39 345/89 |

(Continued)

FOREIGN PATENT DOCUMENTS

| | | |
|---|---|---|
| JP | 2000299706 A | 10/2000 |
| JP | 2001358779 A | 12/2001 |

(Continued)

*Primary Examiner* — Ryan Johnson
*Assistant Examiner* — Colleen J O Toole
(74) *Attorney, Agent, or Firm* — Rabin & Berdo, P.C.

(57) ABSTRACT

A semiconductor device includes: a pair of input terminals or receiving a first input signal and a second input signal each of which changes between potentials in a predetermined range via a pair of transmission paths which include a first transmission path and a second transmission path; a first reception circuit which compares in potential the first input signal with the second input signal, and generates a first output signal based on a comparison result therebetween; a second reception circuit which generates a second output signal based on a comparison result of comparing in potential at least one of the first input signal and the second input signal with a reference potential.

4 Claims, 6 Drawing Sheets

(56) References Cited

U.S. PATENT DOCUMENTS 7,719,322 B2 * 5/2010 Hayashi .................. H03K 5/19
327/50

FOREIGN PATENT DOCUMENTS

| JP | 2006332763 A | 12/2006 |
| JP | 2008277966 A | 11/2008 |
| JP | 2009075592 A | 4/2009 |
| JP | 2013009118 A | 1/2013 |

* cited by examiner

SEMICONDUCTOR DEVICE

CROSS-REFERENCE TO RELATED APPLICATION

This application is based upon and claims the benefit of priority from the prior Japanese Patent Application No. 2018-202824 filed on Oct. 29, 2018, the entire contents of which are incorporated herein by reference.

BACKGROUND OF THE INVENTION

1. Field of the Invention

The present invention relates to a semiconductor device.

2. Description of the Related Art

In semiconductor devices including semiconductor integrated circuits, data may be transmitted as differential signals through a pair of transmission paths provided between semiconductor devices. For example, in a display device such as a liquid crystal device, organic EL device or the like, an image data signal is transmitted as differential signals between a T-CON (Timing Controller) and a display driver (for example, Japanese Unexamined Patent Application Publication No. 2013-9118).

SUMMARY OF THE INVENTION

There is a case where it may be necessary to transmit some information other than data between devices as described above that transmit data as differential signals via the pair of transmission paths. For example, in a display device provided with a plurality of display drivers, when changing the setting of the display driver, transmission of setting information is performed from the T-CON to the display driver. In the normal case, the transmission of setting information is performed using a signal line separate from the transmission path for data transmission.

When one signal line is commonly used to transmit setting information or the like between one T-CON and a plurality of display drivers, any optional display driver cannot be selected and controlled, resulting in controlling them at once. Therefore, there is a problem that the degree of freedom of control is low. On the other hand, in order to select one of the plurality of display drivers and change the setting, it is necessary to separately provide signal lines connecting the T-CON and the plurality of display drivers respectively. Thus there is a problem that the device scale would increase.

The present invention has been made in view of the above problems. The purpose of the present invention is to provide a semiconductor device capable of receiving, through a transmission path for transmitting a binary data signal, a signal different from the binary data signal.

A semiconductor device includes: a pair of input terminals for receiving a first input signal and a second input signal each of which changes between potentials in a predetermined range via a pair of transmission paths which include a first transmission path and a second transmission path; a first reception circuit which compares in potential the first input signal with the second input signal, and generates a first output signal based on a comparison result therebetween; a second reception circuit which generates a second output signal based on a comparison result of comparing in potential at least one of the first input signal and the second input signal with a reference potential.

According to the semiconductor device of the present invention, it is possible to receive, through a transmission path for transmitting a binary data signal, a signal different from the binary data signal, and to perform control with a high degree of freedom while suppressing an increase in device scale.

DETAILED DESCRIPTION OF THE INVENTION

Figure 1:
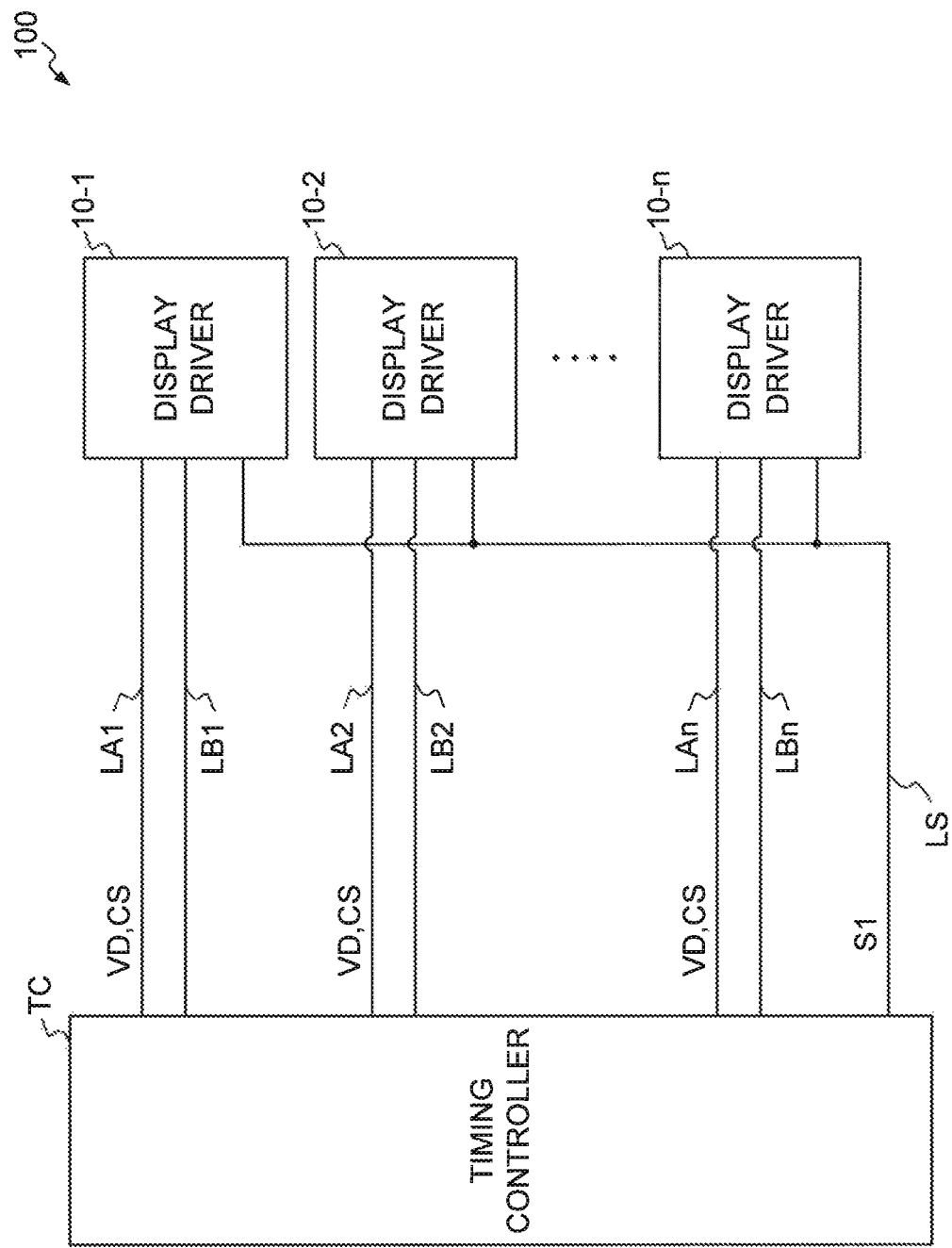
FIG. 1 is a block diagram showing a configuration of a signal transmission system including display drivers of a first embodiment.

Hereinafter, preferred embodiments of the present invention will be described in detail. In the description of the following embodiments and the accompanying drawings, substantially the same or equivalent parts are denoted by the same reference numerals.

First Embodiment

FIG. 1 is a block diagram showing a configuration of a signal transmission system 100 including a display driver of this embodiment. The signal transmission system. 100 is a system that transmits signals such as image data and control signals or the like between a timing controller and a display driver, which are mounted on a display device such as a liquid crystal display device or an organic EL (Electro Luminescence) display device or the like. The signal transmission system 100 is constructed by a timing controller TC and a plurality of display drivers 10-1 to 10-$n$ ($n$ is an integer equal to or greater than 3).

The timing controller TC is a display control device that controls display of images on a display device by supplying image data signals to each of the display drivers 10-1 to 10-$n$. The timing controller TC and the display drivers 10-1 to 10-$n$ are connected to each other by pairs of transmission paths LA1 and LB1, LA2 and LB2, ..., Lan and LBn. The timing controller TC causes respective electrical potentials of the pair of transmission paths to be changed to a first potential (H level) or second potential (L level), thereby supplying the image data signals VD to the display drivers 10-1 to 10-$n$ as differential signals.

Further, the timing controller TC supplies the state control signals CS to the display drivers 10-1 to 10-$n$ via the pairs of transmission paths. The state control signals CS are signals for controlling the operation states of the display drivers 10-1 to 10-$n$ to states different from a normal operation state in which an operation for image display is performed. For example, in this embodiment, each of the display drivers 10-1 to 10-$n$ is controlled to an operating state for changing the settings thereof by the received state control signals CS. The timing controller TC supplies the state control signals CS by changing the potentials of the pair of transmission paths to a third potential different from either the first potential or the second potential. The state control signals CS are transmitted via the pairs of transmission paths at timings different from those of the image data signals VD.

Further, the timing controller TC and the display drivers 10-1 to 10-*n* are connected to each other by a common signal line LS. The timing controller TC supplies setting information signals S1 relating to the setting of the display drivers 10-1 to 10-*n* to the display drivers 10-1 to 10-*n* via a signal line LS. The respective setting information signals S1 include respective setting information for changing the setting of the display drivers 10-1 to 10-*n*, and respective mode designation information for specifying the operation mode when the setting is changed, and respective specific codes SC specifying one display driver to be subjected to setting change from among the display drivers 10-1 to 10-*n*.

Figure 2:
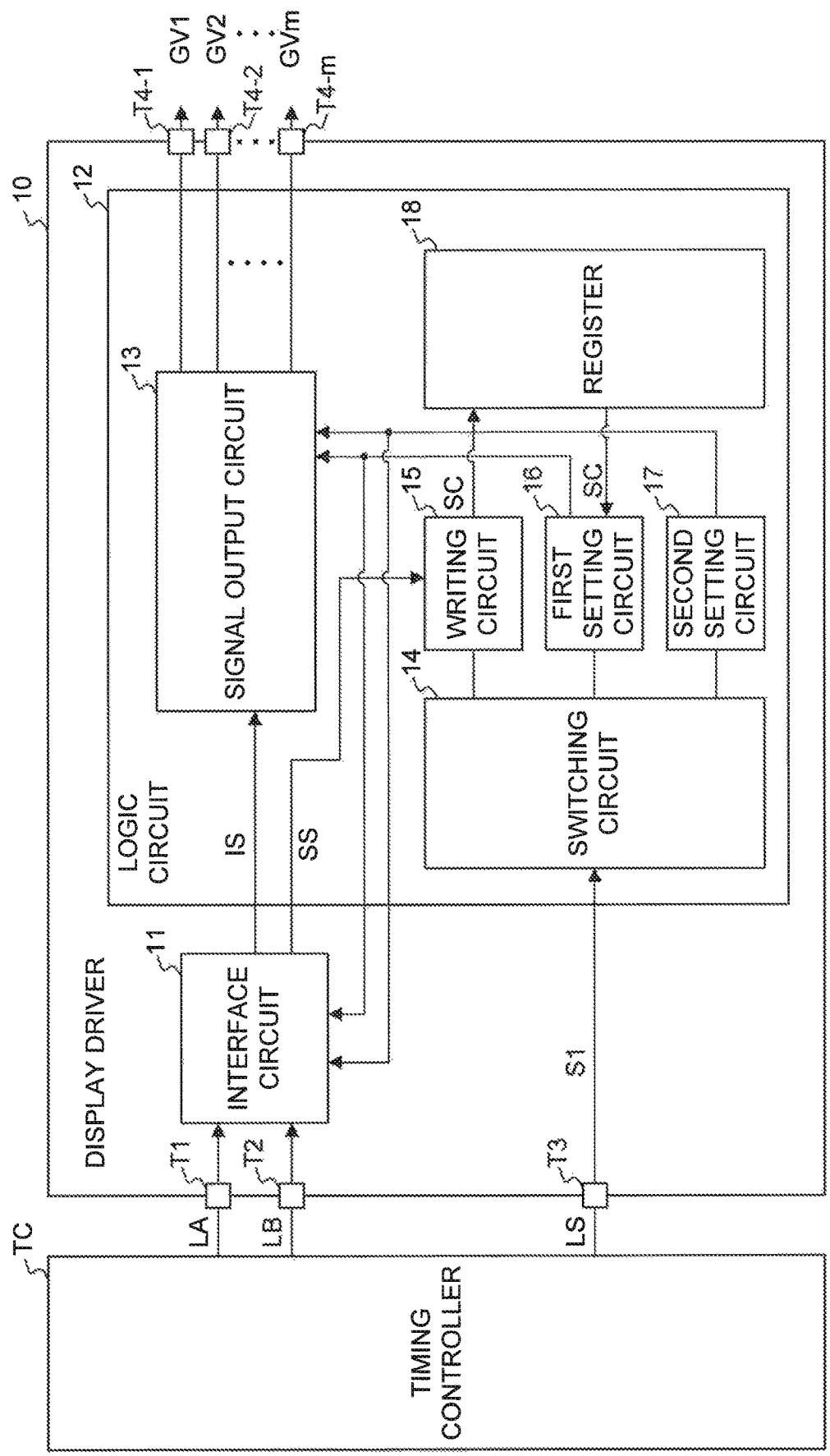
FIG. 2 is a block diagram showing a configuration of a display driver of the first embodiment.

FIG. 2 is a block diagram showing a configuration of one display driver 10 representative of the display drivers 10-1 to 10-*n*. The display driver 10 is constructed by an interface circuit 11 and a logic circuit 12. The display driver 10 includes input terminals T1 and T2 connected to a pair of transmission paths LA and LB (i.e., LA1 and LB1 shown in FIG. 1), an input terminal T3 receiving input of a setting information signals S1 via a signal line LS, and an output terminals T4-1 to T4-*m* (for example, m being an integer equal to or greater than 3) that output gradation voltage signals GV1 to GVm.

The interface circuit 11 converts the image data signals VD, transmitted as a differential signal through the pair of transmission paths LA and LB, into a single-ended signal to generate an image signal IS. Further, the interface circuit 11 generates the state setting signal SS based on the state control signals CS supplied from the timing controller TC. The interface circuit 11 supplies the image signal IS and the state setting signal SS to the logic circuit 12.

The logic circuit 12 includes a signal output circuit 13, a switching circuit 14, a writing circuit 15, a first setting circuit 16, a second setting circuit 17, and a register 18.

The signal output circuit 13 receives the single end image signal IS from the interface circuit 11, and generates gradation voltage signals GV1 to GVm corresponding to the image signal IS, and outputs them from the output terminals T4-1 to T4-*m* respectively. The output gradation voltage signals GV1 to GVm are supplied to data lines provided on a display panel (not shown).

The switching circuit 14 supplies the setting information signal S1, input from the input terminal T3, into the writing circuit 15, the first setting circuit 16, or the second setting circuit 17. The switching circuit 14 switches the supply destination of the setting information signal S1 to any one of the writing circuit 15, the first setting circuit 16, and the second setting circuit 17 based on the mode designation information included in the setting information signal S1.

For example, when the mode designation information included in the setting information signal S1 is designation information of the "writing mode" for instructing the writing operation of the specific code SC, the switching circuit 14 supplies the setting information signal S1 to the writing circuit 15 to execute the writing operation. Further, when the mode designation information is designation information of the "first setting mode" for instructing the display driver 10 to perform a unique setting (i.e., setting different from the other display drivers), the switching circuit 14 supplies the setting information signal S1 to the first setting circuit 16 to execute that setting operation. Further, when the mode designation information is designation information of the "second setting mode" for instructing the operation to be common to the display drivers 10-1 to 10-*n*, the switching circuit 14 supplies the setting information signal S1 to the second setting circuit 17 to execute that setting operation.

The write circuit 15 is a writer device that writes a specific code SC, which is a data code for specifying one display driver to be subjected to setting change, into the register 18. The write circuit 15 receives the setting information signal S1 from the timing controller TC via the switching circuit 14. Then, in response to the supply of the state setting signal SS from the interface circuit 11, the write circuit 15 writes the specific code SC included in the setting information signal S1 into the register 18. Specifically, when the write circuit 15 receives the state setting signal SS of logic level "1", it writes the specific code SC into the register 18.

The first setting circuit 16 receives the setting information signal S1 from the timing controller TC via the switching circuit 14. Then, the first setting circuit 16 reads the specific code SC from the register 18, and only when the specific code associated with the setting information included in the setting information signal S1 matches the specific code SC read out from the register 18, the first setting circuit 16 changes the setting of the interface circuit 11 and the signal output circuit 13. The first setting circuit 16 does not execute the setting change operation, if the specific code SC is not stored in the register 18. Also if the specific code SC read from the register 18 is different from the specific code linked to the setting information of the setting information signal S1, the first setting circuit 16 does not execute the setting change operation. In addition, the first setting circuit 16 is configured to be able to change the setting of other circuits other than the signal output circuit 13 in the logic circuit 12.

The second setting circuit 17 receives the setting information signal S1 from the timing controller TC via the switching circuit 14. Then, the second setting circuit 17 acquires setting information common to each of the display drivers (i.e., the display drivers 10-1 to 10-*n* shown in FIG. 1) included in the setting information signal S1, and changes the setting of the interface circuit 11 and the signal output circuit 13. Similarly to the first setting circuit 16, the second setting circuit 17 is configured to be able to change the setting of other circuits other than the signal output circuit 13 in the logic circuit 12.

The register 18 stores the specific code SC in response to a write operation by the write circuit 15.

Figure 3:
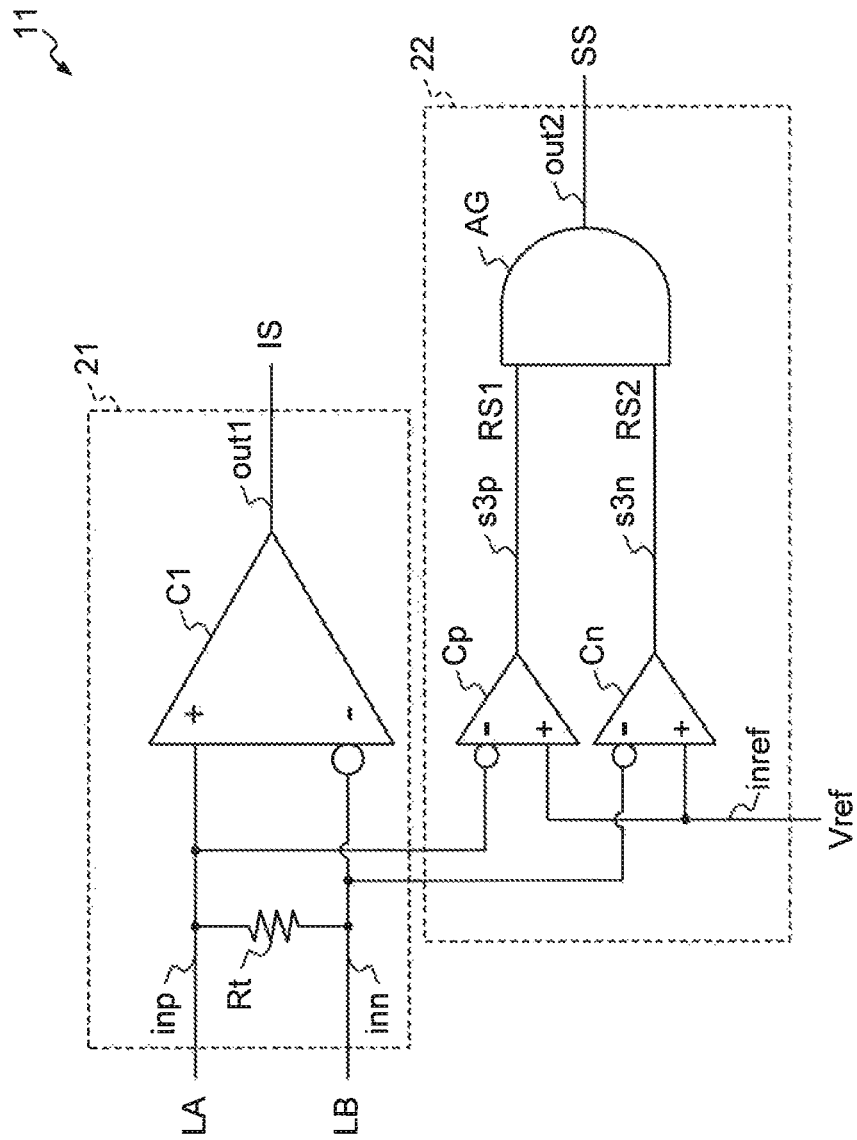
FIG. 3 is a circuit diagram showing the configuration of an interface circuit of the first embodiment.

Next, the interface circuit 11 will be described in detail. FIG. 3 is a circuit diagram showing the configuration of the interface circuit 11. The interface circuit 11 is constructed by a first reception circuit 21 and a second reception circuit 22.

The first reception circuit 21 includes a first input terminal inp, a second input terminal inn, a termination resistor Rt, a differential input type reception circuit C1, and a first output terminal out1.

The first input terminal inp and the second input terminal inn are connected to a pair of transmission paths LA and LB (i.e., LA1 and LB 1 shown in FIG. 1) for transmitting a differential signal from the timing controller TC. The termination resistor Rt is connected to the first input terminal inp and the second input terminal inn.

The differential input type reception circuit C1 includes a comparator circuit, and has an equalizer function, a serial parallel conversion function, and the like as well as a comparator function. In the differential input type receiving circuit C1, its non-inverting input terminal (i.e., a positive input terminal) is connected to the first input terminal inp, and its inverting input terminal (i.e., a negative input terminal) is connected to the second input terminal inn. The differential input type reception circuit C1 compares in potential the first input terminal inp with the second input terminal inn, and outputs an output signal of logic level "1" or "0" according to the comparison result as an image signal IS from the first output terminal out1.

The second reception circuit 22 includes a reference potential input terminal inref, a positive phase comparator Cp (first comparator), a negative phase comparator Cn (second comparator), an AND gate circuit AG, and a second output terminal out2.

A reference potential Vref for determining the signal level of the state control signals CS is applied to the reference potential input terminal inref.

The positive phase comparator Cp has an inverting input terminal connected to the first input terminal inp, and a non-inverting input terminal connected to the reference potential input terminal inref. The positive phase comparator Cp compares in potential the first input terminal inp with the reference potential Vref, and outputs a first detection signal RS1 having a logic level "1" or "0" indicating a comparison result from the first detection signal output terminal s3p.

The negative phase comparator Cn has an inverting input terminal connected to the second input terminal inn, and a non-inverting input terminal connected to the reference potential input terminal inref. The negative phase comparator Cn compares in potential the second input terminal inn with the reference potential Vref, and outputs the second detection signal RS2 of the logic level "1" or "0" indicating the comparison result from the second detection signal output terminal s3n.

The AND gate circuit AG generates the logical product of the first detection signal RS1 output from the positive phase comparator Cp and the second detection signal RS2 output from the negative phase comparator Cn as a state setting signal SS and outputs it from the second output terminal out2.

Figure 4:
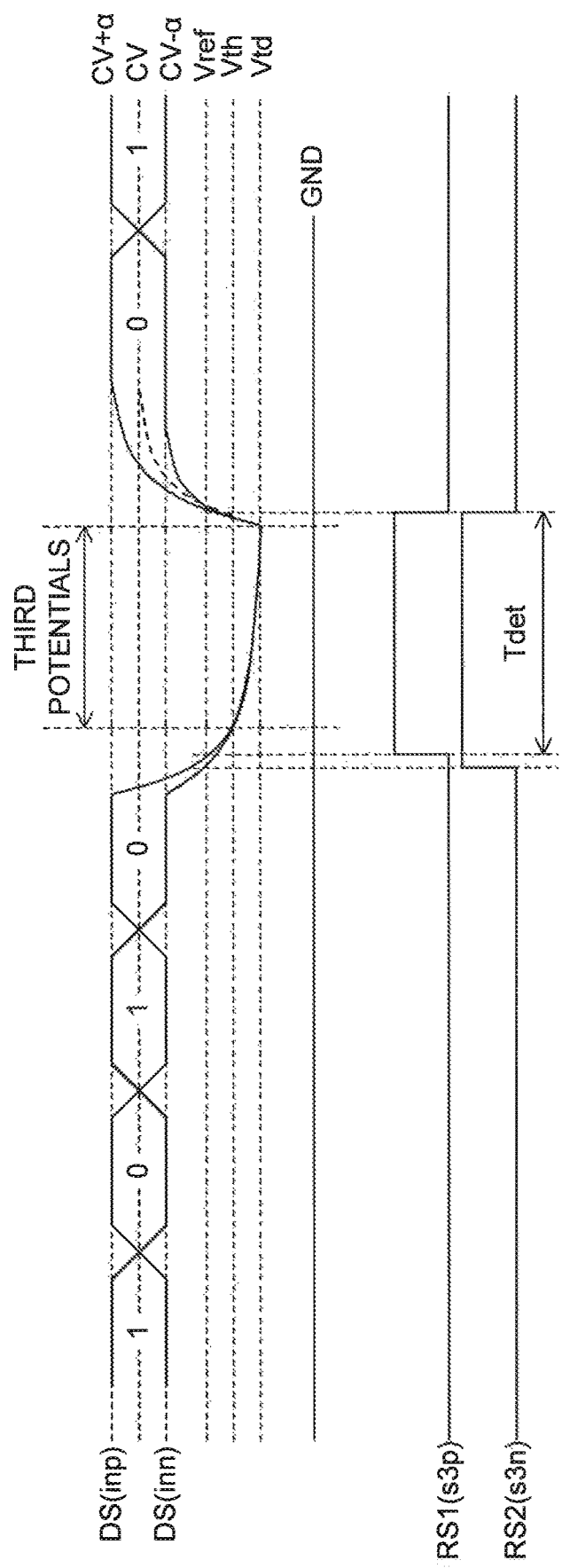
FIG. 4 is a time chart showing signals input to and output from the interface circuit of the first embodiment.

Next, the operation of the interface circuit 11 according to the present embodiment will be described. FIG. 4 is a time chart showing the signal input/output to/from the interface circuit 11.

First, the timing controller TC supplies the image data signals VD as differential signals DS through the pair of transmission lines LA and LB to cause the display driver 10 to perform the normal image display operation. Specifically, the timing controller IC changes the electric potentials of the pair of transmission lines LA and LB to ±α around the center potential CV, thereby supplying the image data signals VD representing the 2 valued data to the display driver 10. Accordingly, there is a stated in that the electric potentials of the first input terminal inp and the second input terminal inn of the interface circuit 11 are changed between the first potential CV+α and the second potential CV−α around the center potential CV in the differential signals DS. For example, when the center potential CV=0.4 V and α=0.0375 V, the first potential=0.4375 V and the second potential=0.3625 V.

The differential input type reception circuit C1 constituting the first reception circuit 21 compares in potential the first input terminal inp with the second input terminal inn. Then, the differential input type reception circuit C1 outputs a signal having a logic level "1", when the potential of the first input terminal inp is higher than the potential of the second input terminal inn, alternatively outputs a signal having a logic level "0", when the potential of the first input terminal inp is less than the potential of the second input terminal inn, as the image signal IS, from the first output terminal out1. In the following description, a state in which a signal having a logic level "0" is output as the image signal IS is referred to as a first state, and a state in which a signal having a logic level "1" is output is referred to as a second state.

Next, in order to control the display driver 10 to be in an operation state for setting change, the timing controller TC sets the potentials of the pair of transmission lines LA and LB to third potentials (for example, Vtd in FIG. 4) different from the first potential (CV+α) and the second potential (CV−α), and thereby supplies the state control signals CS to the display driver 10. As a result, the display driver 10 is controlled to be in a third state different from the first state and the second state.

For example, the timing controller TC sets to lower the potentials of the pair of transmission lines LA and LB to third potentials less than or equal to the threshold potential Vth, thereby supplying the state control signals CS to the display driver 10. The threshold potential Vth is a potential sufficiently lower than, for example, the first potential (CV+α) and the second potential (CV−α). For example, when the first potential is set to 0.4375 V and the second potential is set to 0.3625, the threshold potential is set to, for example, 0.2 V. When the potentials of the pair of transmission lines LA and LB are equal to or lower than the threshold potential Vth, the potentials of the first input terminal inp and the second input terminal inn of the interface circuit 11 also fall to the threshold potential Vth or lower.

The positive phase comparator Cp constituting the second reception circuit 22 compares in potential the first input terminal inp with the reference potential Vref. The reference potential Vref is set to a potential lower than the center potential CV and higher than the threshold potential Vth. For example, when the center potential CV=0.4 V and the threshold potential Vth=0.2 V, the reference potential Vref=0.3 V. The positive phase comparator Cp outputs the first detection signal RS1 of logic level "1" (i.e., H level) in a period in which the potential of the first input terminal inp is reduced to a potential level equal to or lower than the reference potential Vref.

The negative phase comparator Cn compares in potential the second input terminal inn with the reference potential Vref. The negative phase comparator Cn outputs the second detection signal RS2 of logic level "1" (i.e., H level) in a period in which the potential of the second input terminal inn is reduced to a potential level equal to or lower than the reference potential Vref.

The AND gate circuit AG outputs the logical product of the first detection signal RS1 and the second detection signal RS2 as a state setting signal SS. Thereby, during the period Tdet in which both of the first detection signal RS1 and the second detection signal RS2 are at the H level, the state setting signal SS of the logic level "1" is output.

As described above, the interface circuit 11 of the present embodiment includes: a first receiver circuit 21 which compares in potentials a pair of transmission paths LA and LB to output an image signal IS indicating a value of the image data signals VD based on a comparison result therebetween; as well as a second reception circuit 22 which compares in electric potentials the pair of transmission lines LA and LB with a predetermined reference potential (reference potential Vref), and outputs a detection signal (state setting signal SS) for detecting that the state control signals CS is transmitted based on a comparison result therebetween.

According to the foregoing configuration, to detect that the potentials of the pair of transmission paths LA and LB being the third potential different from the first potential and the second potential indicating a data value of the image data signals VD enables to supply different signals (state control signals CS) to the pair of transmission paths LA and LB. Therefore, according to the configuration of the display driver 10 of the present embodiment, it is possible to receive the signal other than the binary data signal while suppressing the increase in the scale of the apparatus.

In particular, as shown in FIG. 1, in the signal transmission system consisting of the timing controller TC and the display drivers 10-1 to 10-n, it is possible to select any display driver by supplying state control signals CS. Therefore, it is possible to change the setting by supplying unique setting information to respective display drivers while suppressing an increase in the size of the device.

Second Embodiment

Next, a second embodiment of the present invention will be described. The display driver of the present embodiment is different from the display driver 10 of the first embodiment in the configuration of the interface circuit 11.

Figure 5:
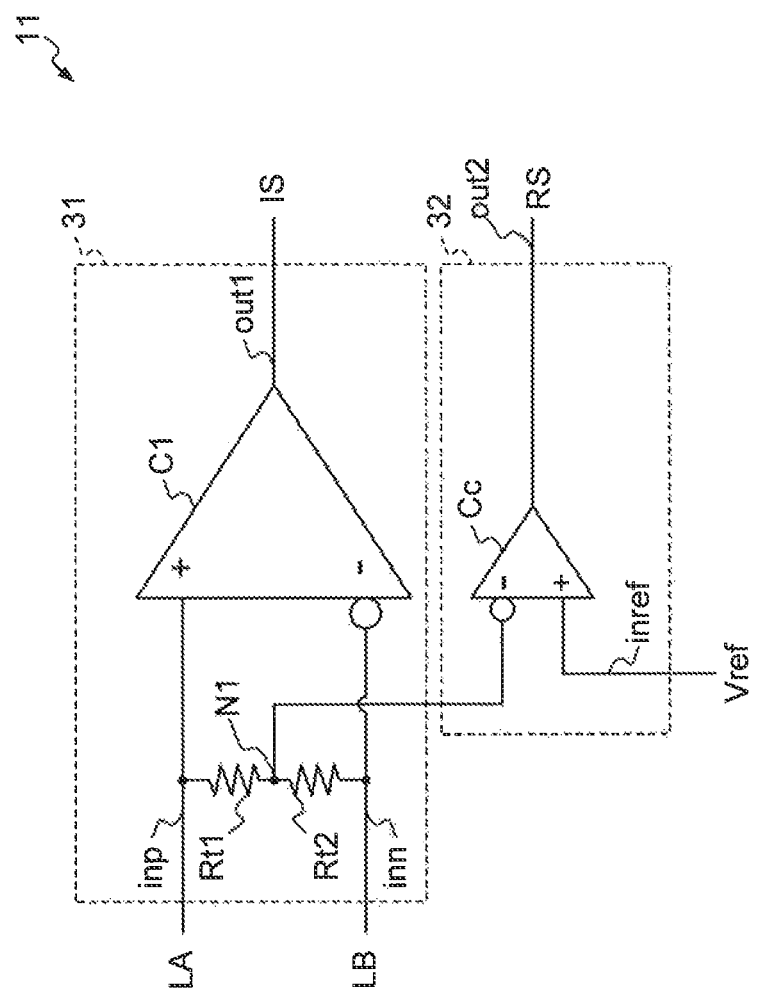
FIG. 5 is a circuit diagram showing a configuration of an interface circuit of a second embodiment.

FIG. 5 is a circuit diagram showing the configuration of the interface circuit 11 according to the present embodiment. The interface circuit 11 according to the present embodiment includes a first reception circuit 31 and a second reception circuit 32.

The first reception circuit 31 includes a first input terminal inp, a second input terminal inn, a first termination resistor Rt1, a second termination resistor Rt2, a differential input type reception circuit C1, and a first output terminal out1.

In contrast to the first receiving circuit 21 of the first embodiment, a first terminating resistor Rt1 and a second terminating resistor Rt2 are connected to the first input terminal inp and the second input terminal inn. Each of the first termination resistor Rt1 and the second termination resistor Rt2 has a resistance value of ½ of the termination resistance Rt of the first embodiment. The first termination resistor Rt1 and the second termination resistor Rt2 are connected to each other via a node N1.

The second reception circuit 32 includes a reference potential input terminal inref, a common comparator Cc, and a second output terminal out2.

The inverting input terminal of the common comparator Cc is connected to the node N1 between the first terminating resistor Rt1 and the second terminating resistor Rt2. The non-inverting input terminal of the common comparator Cc is connected to the reference potential input terminal inref. The common comparator Cc compares in potential the node N1 with the reference potential Vref, and outputs a detection signal RS of logic level "1" or "0" indicating the comparison result from the second output terminal out2.

Figure 6:
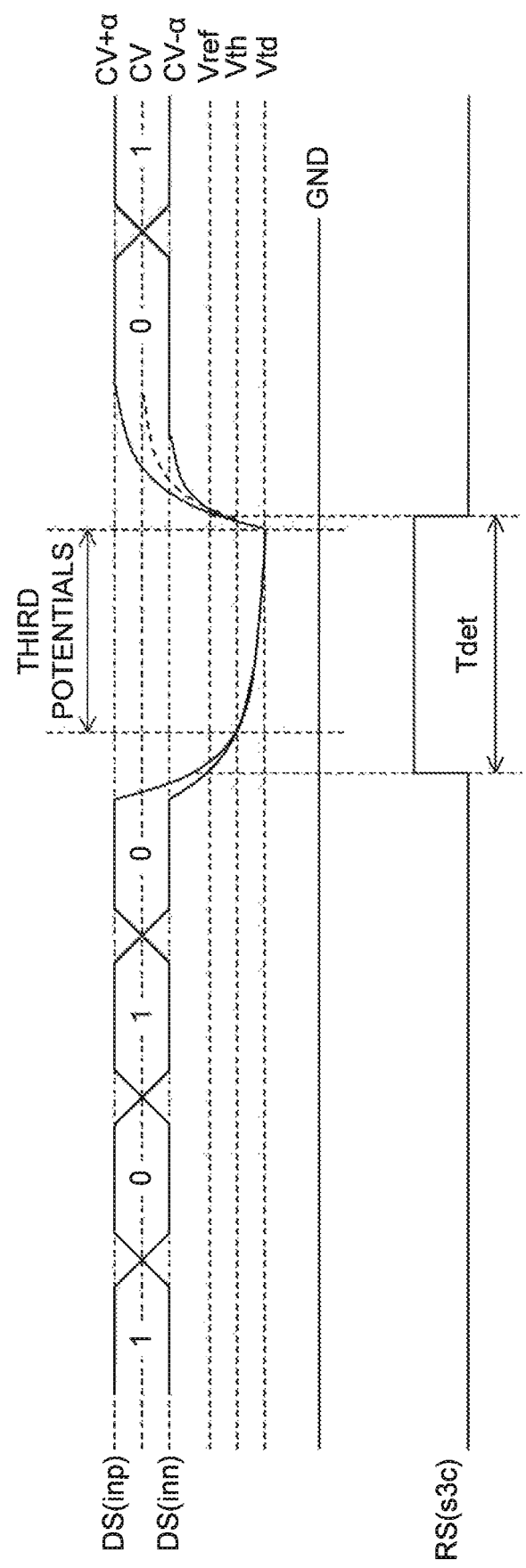
FIG. 6 is a time chart showing signals input to and output from the interface circuit of the second embodiment.

FIG. 6 is a time chart showing a signal input/output by the interface circuit 11 according to the present embodiment.

First, the timing controller TC supplies the image data signals VD as differential signals DS through the pair of transmission lines LA and LB to cause the display driver 10 to perform the normal image display operation. The differential input type reception circuit C1 constituting the first reception circuit 31 compares in potential the first input terminal inp with the second input terminal inn. Then, the differential input type reception circuit C1 outputs a signal having a logic level "1" when the potential of the first input terminal inp is higher than the potential of the second input terminal inn, alternatively outputs a signal having a logic level "0" when the potential of the first input terminal inp is less than the potential of the second input terminal inn, as the image signal IS, from the first output terminal out1.

In the first or second state, even if the potentials of the first input terminal inp and the second input terminal inn are changed, the potential of the node N1 located at the midpoint between the first termination resistor Rt1 and the second termination resistor Rt2 does not change ideally. Therefore, even if the load increases due to the fact that the common comparator Cc is connected to the first termination resistor Rt1 and the second termination resistor Rt2, it does not interfere with the reception of the data signal which has been transmitted at high speed via the first input terminal inp and the second input terminal inn.

Next, in order to control the display driver 10 to be in an operation state for setting change, the timing controller TC sets the potentials of the pair of transmission lines LA and LB to third potentials (for example, Vtd in FIG. 6) different from the first potential and the second potential, and thereby supplies the state control signals CS to the display driver 10. As a result, the display driver 10 is controlled to be in a third state different from the first state and the second state.

The common comparator Cc constituting the second reception circuit 32 compares in potential the node N1 with the reference potential Vref. The common comparator Cc outputs a detection signal RS of logic level "1" (i.e., H level) in a period in which the potential of the node N1 is reduced to a potential level equal to or lower than the reference potential Vref.

Since the node N1 is located at the midpoint between the first terminating resistor Rt1 and the second terminating resistor Rt2, the potential of the node N1 is denoted ideally as follows: the potential of the node N1=(potential of the first input terminal inp+potential of the second input terminal inn)/2. That is, when the potentials of the first input terminal inp and the second input terminal inn are lower than the threshold potential Vth, the potential of the node N1 which is the midpoint between the first termination resistor Rt2 and the second termination resistor Rt2 is equal to or lower than the threshold potential Vth. Therefore, the third state can be detected by comparing in potential the node N1 with the reference potential Vref.

According to the interface circuit 11 of the present embodiment, the number of comparators is smaller than that of the interface circuit 11 according to the first embodiment, and the same operation can be realized with a small-scale circuit configuration. Therefore, according to the interface circuit 11 of the present embodiment, it is possible to receive the signal other than the 2 valued data signal while suppressing the device scale.

It should be noted that the present invention is not limited to the above embodiment. For example, in the above embodiment, when the center potential CV=0.4 V and the threshold potential Vth=0.2 V, the reference potential Vref is 0.3 V. However, the value of the reference potential Vref is not limited to this. Although the reference potential Vref is ideally close to the threshold voltage Vth, the reference potential Vref may be at least a voltage lower than the central potential CV of the differential signal DS and higher than the threshold potential Vth.

Further, in the above embodiment, the case where the threshold voltage Vth is 0.2 V is described when the center potential CV=0.4 V and α=0.0375 V. However, the value of the threshold potential Vth is not limited to this. The threshold potential Vth may be a value sufficiently lower than the first potential (CV+α) and the second potential (CV−α) representing the data value of the image data signals VD.

Further, in the first embodiment described above, an example has been described in which the termination resistor Rt, the first termination resistor Rt1 and the second termination resistor Rt2 in the second embodiment are provided inside the interface circuit 11. However, these termination resistors may be provided outside the interface circuit 11 (i.e., outside the chip).

Further, the reference potential Vref may be supplied from the outside of the interface circuit 11 to the reference potential input terminal inref, or may be generated inside the interface circuit 11.

In addition, in the first embodiment described above, there has been described the configuration in which the third state is determined based on the comparison result comparing in potential the first input terminal inp with the reference potential Vref and the comparison result comparing in potential the second input terminal inn with the reference potential Vref. However, the potential of either one of the first input terminal inp and the second input terminal inn may be compared with the reference potential Vref.

Further, in the first embodiment described above, the non-inverting input terminal of the positive phase comparator Cp (i.e., input terminal of the positive logic) is connected to the reference potential input terminal inref, and the inverting input terminal (i.e., input terminal of the negative logic) thereof is connected to the first input terminal inp. However, in contrast to this, the positive phase comparator Cp may have a configuration in which its non-inverting input terminal may be connected to the first input terminal inp, and its inverting input terminal may be connected to the reference potential input terminal inref. In this case, the positive phase comparator Cp outputs the first detection signal RS1 of logic level "0" (i.e., L level) in a period in which the potential of the first input terminal inp is reduced to a potential level equal to or lower than the reference potential Vref.

Similarly, contrary to the configuration of the first embodiment, the negative phase comparator Cn may have a configuration in which its non-inverting input terminal is connected to the second input terminal inn and its inverting input terminal is connected to the reference potential input terminal inref. In this manner that connection relationship between the non-inverting input terminal and the inverting input terminal in the positive phase comparator Cp and the negative phase comparator Cn is made reverse to that in the first embodiment, it is possible to output a state setting signal SS that becomes a logic level "1" (i.e., H level) in the third state, by providing a NAND gate circuit instead of the AND gate circuit AG of the first embodiment.

Further, in the second embodiment described above, the non-inverting input terminal of the common comparator Cc is connected to the reference potential input terminal inref and the inverting input terminal of the common comparator Cc is connected to the node N1. However, in contrast to this, the common comparator Cc may have a configuration in which its non-inverting input terminal is connected to the node N1, and its inverting input terminal is connected to the reference potential input terminal inref. In this case, the common comparator Cc outputs a detection signal RS of logic level "0" (i.e., L level) in a period in which the potential of the node N1 is reduced to a potential level equal to or lower than the reference potential Vref.

Further, in the above embodiments, the present invention is applied to a display driver mounted on a liquid crystal display device, an organic EL display device, or the like. However, the present invention is not limited to the display driver, and can be applied to various semiconductor devices that transmit data signals as differential signals.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

What is claimed is:

1. A display driver comprising:
a pair of input terminals for receiving a first input signal and a second input signal each of which changes in a predetermined range between a first potential and a second potential so as to form a differential signal via a pair of transmission paths which include a first transmission path and a second transmission path;
a signal input terminal connected to a signal line different from the pair of transmission paths, for receiving a third input signal via the signal line;
an interface circuit having
a first comparator which compares in potential the first input signal with the second input signal, generates a first output signal based on a comparison result therebetween, and outputs the first output signal, and
a second comparator which generates a second output signal based on a comparison result of comparing in potential a potential of at least one of the first input signal and the second input signal with a reference potential which is outside of said predetermined range, and outputs the second output signal; and
a logic circuit having
a signal output circuit configured to generate gradation voltage signals for supplying to a display panel based on the first output signal, and
a registering portion configured to register a data code based on the second output signal and the third input signal, the data code being a code for specifying one display driver of a plurality of display drivers.

2. The display driver according to claim 1,
wherein the registering portion includes a register, and a writing circuit configured to write the data code into the register.

3. The display driver according to claim 2,
wherein the third input signal includes mode designation information for specifying an operation mode, and the data code, and
when the mode designation information included in the third input signal is designation information of a writing mode for instructing a writing operation of the data code, the writing circuit writes the data code included in the third input signal, into the register in response to the second output signal.

4. The display driver according to claim 3, further comprising a setting circuit configured to change a setting of each of the interface circuit and the signal output circuit when the mode designation information included in the third input signal is designation information of a first setting mode and the data code included in the third input signal matches the data code written in the register.

* * * * *